United States Patent
Alluri et al.

(10) Patent No.: US 6,518,070 B1
(45) Date of Patent: Feb. 11, 2003

(54) PROCESS OF FORMING A SEMICONDUCTOR DEVICE AND A SEMICONDUCTOR DEVICE

(75) Inventors: Prasad V. Alluri, Round Rock, TX (US); Mark Victor Raymond, Austin, TX (US); Sucharita Madhukar, Austin, TX (US); Roland R. Stumpf, Albuquerque, NM (US); Chun-Li Liu, Los Alamos, NM (US); Clarence J. Tracy, Tempe, AZ (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 09/571,586

(22) Filed: May 17, 2000

Related U.S. Application Data

(63) Continuation-in-part of application No. 09/022,756, filed on Feb. 12, 1998, now Pat. No. 6,344,413, which is a continuation-in-part of application No. 08/995,534, filed on Dec. 22, 1997, now abandoned.

(51) Int. Cl.$^7$ .............................................. H01L 21/70
(52) U.S. Cl. ...................... 438/3; 438/396; 438/240; 438/395
(58) Field of Search ................. 438/253, 238, 438/381, 240, 3, 387, 396, 388, 239, 243, 248, 395, 424, 524; 257/310, 295, 301

(56) References Cited

U.S. PATENT DOCUMENTS

| | | | |
|---|---|---|---|
| 4,337,476 A | | 6/1982 | Fraser et al. .................. 357/67 |
| 4,506,279 A | * | 3/1985 | Mizutani .................... 257/396 |
| 4,732,801 A | | 3/1988 | Joshi .......................... 428/198 |
| 5,164,808 A | | 11/1992 | Evans, Jr. et al. .......... 361/305 |
| 5,383,088 A | * | 1/1995 | Chappel-Sokol et al. ... 361/305 |
| 5,393,676 A | * | 2/1995 | Anjum et al. ............... 438/301 |
| 5,396,093 A | * | 3/1995 | Lu .............................. 257/306 |
| 5,407,855 A | | 4/1995 | Maniar et al. ................ 437/60 |
| 5,428,244 A | | 6/1995 | Segawa et al. ............. 257/646 |

(List continued on next page.)

OTHER PUBLICATIONS

Saenger et al., "Properties and Decomposition Behaviors of Reactively Sputtered Pt (O) Electrode Materials," Materials Research Society, Ferroelectric Thin Films VIII, Symposium Y, Nov. 29, 1999.

Saenger et al., "Buried, self–aligned barrier layer structures for perovskite–based memory devices comprising Pt or Ir bottom electrodes on silicon–contributing substrates," American Institute of Physics, pp. 802–813 (1998).

Khamankar et al., "A Novel BST Storage Capacitor Node Technology Using Platinum Electrodes for Gbit DRAMS," IEEE, pp. 245–248 (1997).

Onishi et al., "A New High Temperature Electrode–Barrier Technology on High Density Ferroelectric Capcitor Structure," IEEE, pp. 699–702 (1996).

Grill et al., "Platinum Alloys and Iridium Bottom Electrodes for Perovskite Based Capacitors in DRAM Applications," Integrated Ferroelectrics, vol. 9, pp. 299–308 (1995).

Grill et al., "Base Electrodes for high dielectric constant oxide materials in silicon technology," Materials Research Society, pp. 3260–3265 (1992).

Zurcher et al; U.S. patent application Ser. No. 09/022,756 filed Feb. 12, 1998.

*Primary Examiner*—Carl Whitehead, Jr.
*Assistant Examiner*—Laura M. Schillinger
(74) *Attorney, Agent, or Firm*—Kim-Marie Vo; George R. Meyer

(57) ABSTRACT

A process for forming a capacitor with a high-k dielectric or ferroelectric layer within a semiconductor device is used to reduce the likelihood of oxidation or materials interactions between that layer and an underlying layer. A first electrode layer includes atoms that form along grain boundaries within the first electrode layer to reduce the oxidation of a conductive plug or undesired materials interactions.

19 Claims, 3 Drawing Sheets

U.S. PATENT DOCUMENTS

| | | | |
|---|---|---|---|
| 5,489,548 A | | 2/1996 | Nishioka et al. ............... 437/60 |
| 5,492,855 A | * | 2/1996 | Matsumoto et al. ......... 438/396 |
| 5,576,928 A | * | 11/1996 | Summerfelt et al. ...... 361/321.1 |
| 5,622,893 A | * | 4/1997 | Summerfelt et al. ......... 438/396 |
| 5,677,221 A | * | 10/1997 | Tseng ........................... 437/52 |
| 5,696,018 A | | 12/1997 | Summerfelt et al. .......... 437/60 |
| 5,858,846 A | * | 1/1999 | Tsai et al. .................... 438/303 |
| 5,891,787 A | * | 4/1999 | Gardner et al. .............. 438/424 |
| 5,895,946 A | * | 4/1999 | Hamamoto et al. ......... 257/302 |
| 5,909,043 A | * | 6/1999 | Summerfelt ................. 257/298 |
| 5,955,785 A | * | 9/1999 | Gardner et al. .............. 257/751 |
| 5,973,351 A | * | 10/1999 | Kotecki ....................... 257/310 |
| 5,976,928 A | * | 11/1999 | Kirlin .......................... 438/240 |
| 6,030,866 A | * | 2/2000 | Choi ............................ 438/253 |
| 6,037,264 A | * | 3/2000 | Hwang ........................ 438/714 |
| 6,090,697 A | * | 7/2000 | Xing et al. .................. 438/618 |
| 6,117,689 A | * | 9/2000 | Summerfelt et al. ............ 438/3 |
| 6,153,490 A | * | 11/2000 | Xing et al. .................. 438/396 |
| 6,177,351 B1 | * | 1/2001 | Beratan et al. .............. 438/694 |
| 6,184,550 B1 | * | 2/2001 | Van Buskirk et al. ...... 257/306 |
| 6,191,470 B1 | * | 2/2001 | Forbes ........................ 257/621 |
| 6,194,754 B1 | * | 2/2001 | Aggarwal et al. ........... 257/295 |
| 6,204,172 B1 | * | 3/2001 | Marsh ......................... 438/653 |
| 6,288,420 B1 | * | 9/2001 | Zhang et al. ................ 257/295 |
| 6,303,972 B1 | * | 10/2001 | Agarwal ...................... 257/532 |
| 6,376,355 B1 | * | 4/2002 | Yoon et al. .................. 438/618 |
| 6,391,769 B1 | * | 5/2002 | Lee et al. .................... 438/643 |

\* cited by examiner

PROCESS OF FORMING A SEMICONDUCTOR DEVICE AND A SEMICONDUCTOR DEVICE

RELATED APPLICATIONS

This is a continuation-in-part of U.S. patent application Ser. No. 09/022,756, entitled "Method of Forming a Semiconductor Device" filed on Feb. 12, 1998 now U.S. Pat. No. 6,344,413 which is a continuation-in-part of U.S. patent application Ser. No. 08/995,534, entitled "Method of Forming a Semiconductor Device" filed on Dec. 22, 1997, now abandoned. Both applications are assigned to the current assignee hereof and are incorporated herein by reference.

FIELD OF THE INVENTION

This invention relates in general to processes for forming semiconductor devices, and more particularly, to processes for forming semiconductor devices having a deposited layer.

RELATED ART

High-k dielectrics are needed for capacitors used in semiconductor devices having design rules at or below 0.25 micron. A problem in forming these capacitors has been the unintentional oxidation of conductive plugs that are used to electrically connect the capacitors with other circuitry within the semiconductor device. When forming the capacitor, a first electrode is typically deposited over the conductive plug. The first electrode may have materials incompatibility issues with the conductive plug, or the first electrode may not adequately protect the underlying conductive plug from being oxidized during a subsequent deposition process step or an oxidizing anneal process step typically needed for the high-k dielectric.

A conductive barrier layer may be placed between the bottom electrode and the conductive plug. However, most barrier layers do not always adequately protect the conductive plug from being oxidized because oxygen from the subsequent deposition or anneal process can diffuse to the conductive plug and oxidize it. In addition, most conductive barrier layers that are used within the semiconductor industry cannot withstand annealing temperatures higher than approximately 550° C. At higher temperatures, the barrier layer may partially or completely oxidize, thereby forming a series capacitor with the storage capacitor, and therefore, degrading the overall capacitance density of the device. Additionally, severe oxidation of the plug material may result in a catastrophic failure of the device due to the physical expansion of the oxidized plug material.

BRIEF DESCRIPTION OF THE DRAWINGS

The present invention is illustrated by way of example and not limitation in the accompanying figures., in which like references indicate similar elements, and in which.

Skilled artisans appreciate that elements in the FIGS. are illustrated for simplicity and clarity and have not necessarily been drawn to scale. For example, the dimensions of some of the elements in the FIGS. may be exaggerated relative to other elements to help to improve understanding of embodiments of the present invention.

DETAILED DESCRIPTION

A process for forming a capacitor with a high-k dielectric or ferroelectric layer within a semiconductor device is used to reduce the likelihood of oxidation or materials interactions between that layer and an underlying layer. A first electrode layer includes atoms that form along grain boundaries within the first electrode layer to reduce the oxidation of a conductive plug or undesired materials interactions. The present invention is defined by the claims and is better understood after reading the specification.

Figure 1:
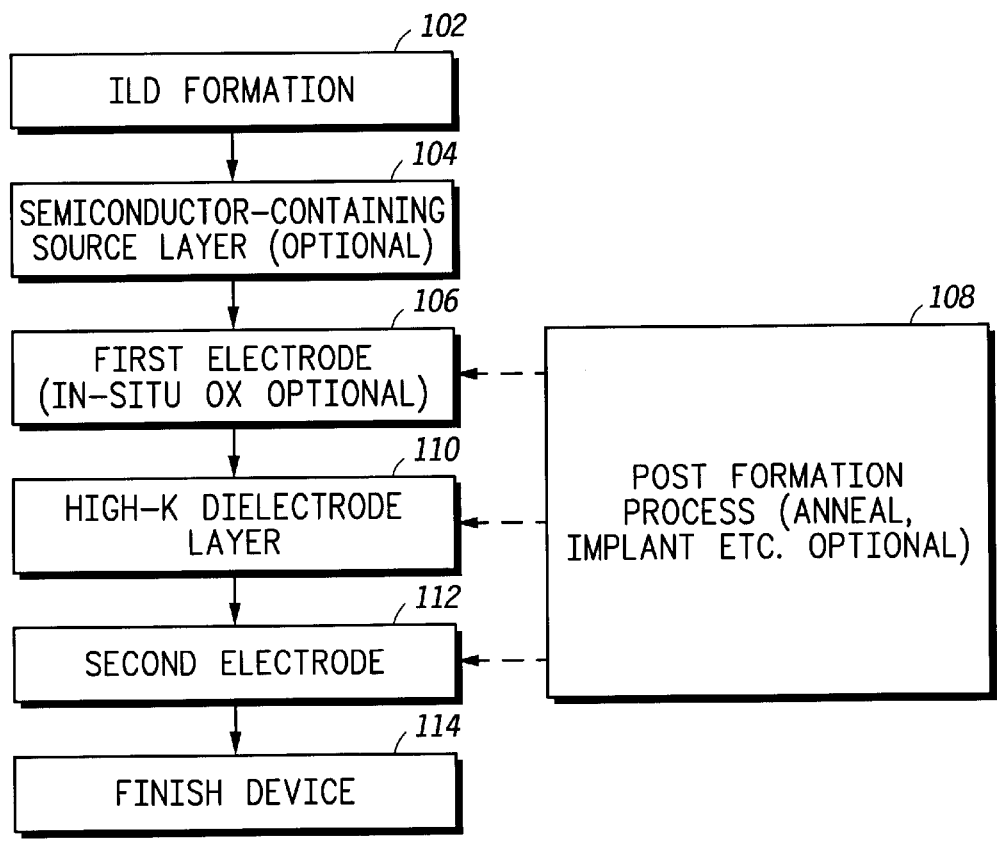
FIG. 1 includes a process flow diagram for forming a high dielectric constant capacitor in accordance with an embodiment of the present invention.
Figure 2:
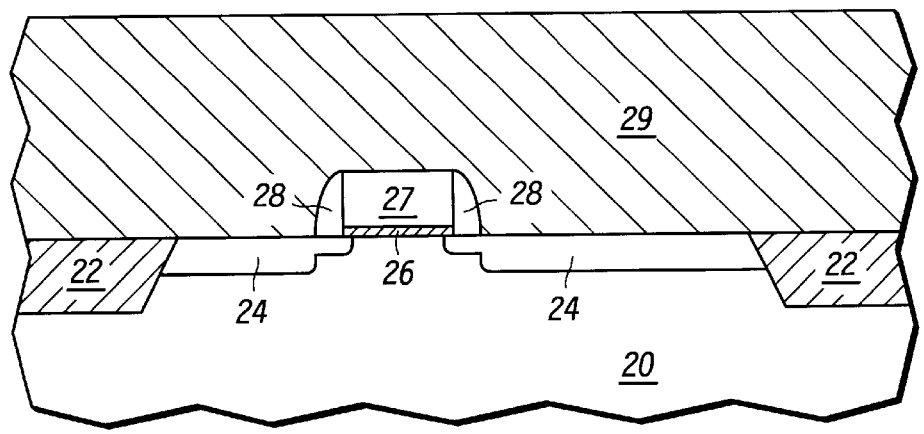
FIGS. 2–7 include illustrations of cross-sectional views of a portion of a semiconductor device during the formation of a high dielectric constant capacitor.

FIG. 1 includes a process flow diagram showing some ways of forming a high-k dielectric capacitor. FIG. 1 will be discussed in conjunction with the illustrations shown in FIGS. 2–7. An interlevel dielectric (ILD) formation step is carried out as shown in box 102. Referring to FIG. 2, a semiconductor device substrate 20 includes field isolation regions 22 and doped regions 24. As used in this specification, a semiconductor device substrate includes a monocrystalline semiconductor wafer, a semiconductor-on-insulator wafer, or any other substrate used for forming semiconductor devices. A gate dielectric layer 26 overlies portions of the semiconductor device substrate 20 and the doped regions 24. A gate electrode 27 overlies the gate dielectric layer 26. Sidewall spacers 28 are formed adjacent to the gate electrode 27 and gate dielectric layer 26. A first ILD layer 29 is then deposited over the semiconductor device substrate 20 and is planarized as shown in FIG. 2.

Figure 3:
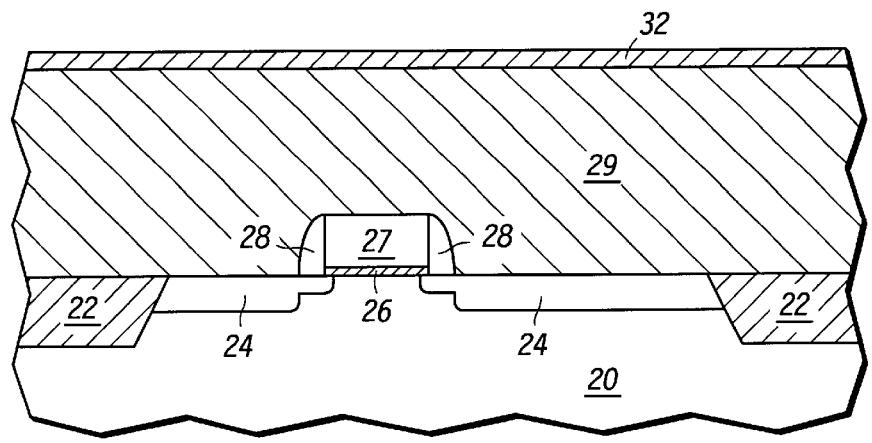

At this point, many variations are possible. One non-limiting embodiment is described here and others will follow. An optional semiconductor-containing source layer 32 is formed over the first ILD layer 29 as shown in FIG. 3 (see box 104 of FIG. 1). The semiconductor-containing source layer 32 has an excess of semiconductive atoms including silicon, germanium, carbon, tin, or the like. In one embodiment, the semiconductor-containing source layer 32 is a silicon-rich silicon nitride layer, a silicon-rich silicon oxide layer, or a silicon-rich silicon oxynitride layer. Typically, layer 32 has a thickness in a range of approximately 5–100 nanometers (nm), and more often has a thickness in a range of approximately 10–30 nm. The amount of extra semiconductor atoms is usually in a range of approximately 3–95 atomic percent of the layer. Still, in another embodiment, layer 32 could be all semiconductive atoms, such as an amorphous silicon layer.

Figure 4:
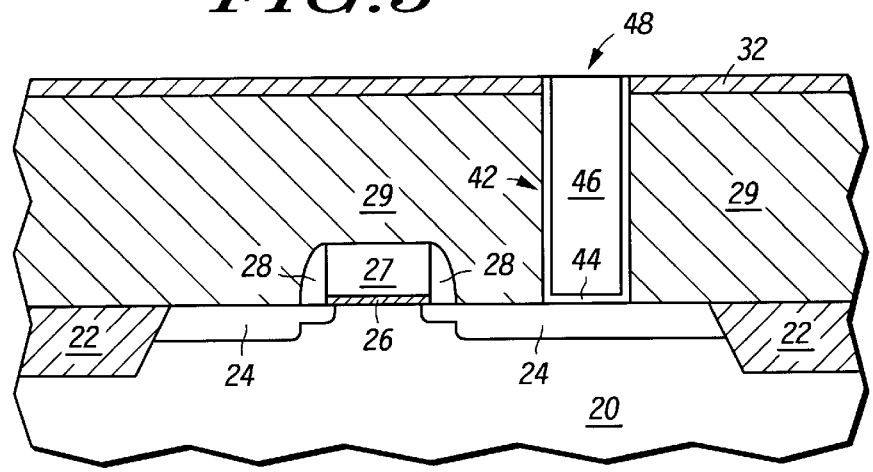

An opening 42 is then formed through the semiconductor-containing source layer 32 and the first ILD layer 29 as seen in FIG. 4. The opening extends through layers 29 and 32 and contacts one of the doped regions 24. After forming the opening, an adhesion/barrier layer 44 and a conductive fill material 46 are formed within the opening 42 and overlying the semiconductor-containing source layer 32. A polishing step is performed to remove portions of films 44 and 46 overlying the semiconductor containing source layer 32 to form a conductive plug 48 as illustrated in FIG. 4. In this specific embodiment, the adhesion/barrier film 44 can include titanium/titanium nitride or other similar compounds. The conductive fill material 46 is tungsten. However, in other embodiments, both the conductive fill material 46 and adhesion/barrier film 44 can be replaced with doped polysilicon.

Figure 5:
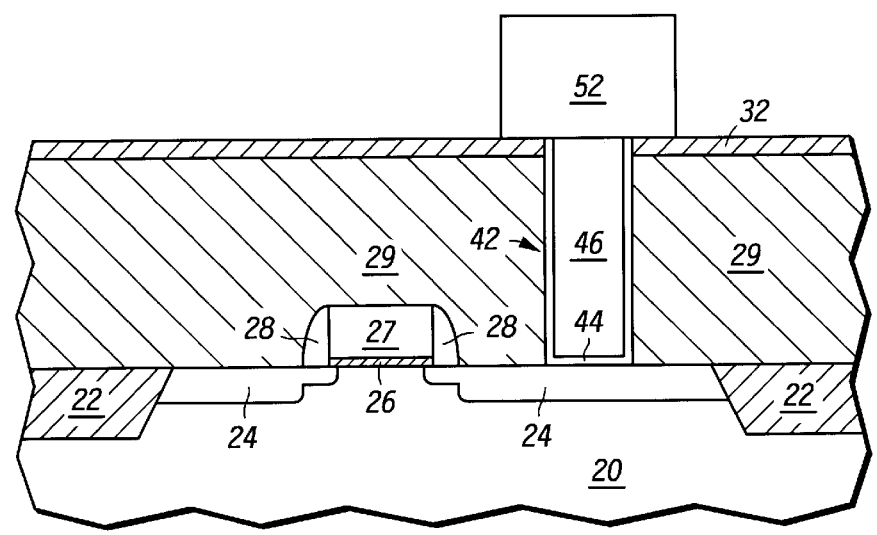

At this point, a first electrode for the capacitor is formed as shown in box 106 in FIG. 1. Referring to FIG. 5, the bottom electrode 52 can be formed using a number of different methods including physical vapor deposition (PVD), chemical vapor deposition (CVD), or plating. The layer is then patterned to form the bottom electrode 52 as shown in FIG. 5. The thickness (height) of the bottom electrode 52 is in a range of approximately 50–200 nm. The bottom electrode 52 includes iridium, platinum, palladium, ruthenium or the like.

The bottom electrode 52 includes appropriately selected dopant elements that preferentially reside at the grain boundaries of the electrode material and tend to strongly interact with oxygen. The combination of the location of the dopant elements in the microstructure and the dopant element's affinity for oxygen inhibits the diffusion of oxygen through the electrode by effectively "stuffing" the grain boundaries. As a result of improving the oxygen barrier qualities of the electrode, the underlying conductive plug material 46 is protected from oxidation during the subsequent processing of the high-k dielectric layer 62 of FIG. 6. These dopants are typically chosen from, but not limited to, Si, Be, Al, Ge, As or a combination thereof.

The method of introduction of these dopants may utilize in-situ or ex-situ (post-formation) processes. The dashed lines connecting box 108 to the flow diagram in FIG. 1 give some, but not all, examples where the post-formation process can be performed. Some examples of the processes used to introduce the dopant atoms include, ion implantation, chemical additions during electrode deposition (PVD, CVD and plating), or by thermal processing in conjunction with the presence of a dopant-containing source layer 32 adjacent to the electrode. With each of these methods the resultant dopant concentration in the electrode is in the range of approximately 0.10 to 20.0 atomic percent.

In one embodiment, ion implantation is used to introduce the dopants into the electrode material. The dose used for the implant depends on many factors. These factors include whether a subsequent anneal is performed and the grain boundary density within the bottom electrode 52. Other factors could likewise affect the dose. While nearly any dose improves the resistance to oxygen diffusion, the ion implantation is typically performed to a dose in the range of approximately 1E15 to 1E16 ions per square centimeter, at an energy of approximately 50 to 100 kiloelectron volts. This implantation is performed such that the projected range of the implant lies near the center of the electrode material. At a dose of approximately 1E15 to 1E16 ions per square centimeter, the bottom electrode has a dopant concentration on the order of approximately 1.0 atomic percent.

Afterward, an annealing step is used to segregate the dopants to the grain boundary regions of the polycrystalline electrode. This anneal does not need to occur immediately after the formation of the electrode but could be performed later. Similarly, the rest of the post formation processing does not need to be performed immediately. For example, the anneal can be performed after the high-k dielectric layer has been formed or even after the second electrode for the capacitor has been formed.

In a second embodiment, the doping can be performed during physical vapor deposition of the bottom electrode layer. In this particular embodiment, the sputtering target used for the electrode deposition would contain the desired dopants as well as the electrode material, or a co-sputtering process could be used where deposition from multiple targets occurs simultaneously. In this embodiment a post formation anneal step is optional.

In a third embodiment, the doping can be performed by allowing the excess dopant atoms contained in the semiconductor source layer 32 to diffuse upward along the grain boundaries of the electrode layer 52 during an anneal cycle. The total anneal is typically performed at a temperature in a range of approximately 400–700° C. for a time in a range of approximately 2 to 30 minutes. Generally, longer times can be used with the lower annealing temperatures, and shorter times are used with the higher annealing temperatures. Typically, this anneal is performed using a rapid thermal process. However, other tools could also be used such as fast ramp or conventional furnaces.

In addition to the introduction of dopants to enhance the oxygen diffusion barrier qualities of the electrode, an optional introduction of small amounts of oxygen to the bottom electrode can prevent possible adverse reactions or interactions between the electrode dopants and the high-k dielectric layer. Through the appropriate introduction of oxygen (see examples below) into the bottom electrode the original dopant atoms are effectively immobilized within the electrode microstructure and are prevented from interacting with the high-k dielectric layer. Two non-limiting, illustrative examples are described in order to clarify the above concept. For a case when the dopant atoms are introduced into the electrode material by using an adjacent layer containing the dopant elements, the subsequent anneal step can be used to introduce oxygen into the electrode. At first, during the anneal cycle an oxygen free ambient is used followed by a second anneal step which can be performed with an oxygen-containing gas, such as oxygen, nitrous oxide, nitric oxide, ozone, or the like. The anneal can be performed with or without plasma assistance. The total anneal is typically performed in the temperature range of approximately 400–700° C. for a time in the range of approximately 2 to 30 minutes.

In the second illustrative example, additional doping of the electrode with oxygen can be performed in-situ during PVD deposition of the electrode layer. The process gases typically include a noble gas and an oxygen-containing gas including oxygen, nitrous oxide, nitric oxide, ozone, or the like. In a similar fashion to the anneal process, the deposition can be performed in two steps; first only the noble gas is used in the plasma followed by a second step where an oxygen-containing gas is introduced. During the second process step, the oxygen-containing gas is approximately 2–50 volume percent of the total feed gases making up the plasma. More often, the oxygen concentration is in the range of approximately 5–20 volume percent. In each of these non-limiting examples, the addition of oxygen will help with the localization of the electrode dopant elements, preventing segregation of the elements to the electrode/high-k dielectric material interface. Utilizing either of these processes, or other processes similar in effect, should prevent the formation of undesirable interfacial layers or a degradation of the electrical characteristics of the high-k dielectric material itself.

Figure 6:
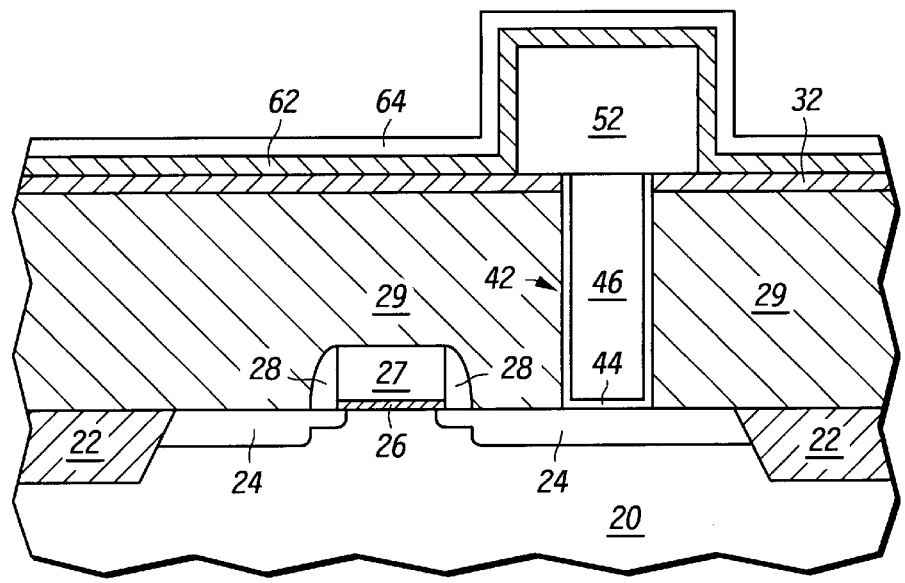

Returning to the capacitor formation, a high-k dielectric layer is then formed as shown in box 110 in FIG. 1. Referring to FIG. 6, the high-k dielectric layer 62 is formed over the first electrode 52. The high-k dielectric layer 62 typically has a dielectric constant of at least 20. Typical materials include barium strontium titanate, lead zirconate titanate, strontium bismuth niobium tantalate, or the like. Alternatively, a ferroelectric material could be used instead of a high-k dielectric material. Although most, but not all, ferroelectric materials have a high dielectric constant, the integration issues with these materials are nearly the same as for high-k dielectrics; namely good adhesion without adverse interactions with adjacent materials. If a dynamic random access memory cell is being formed, layer 62 usually has a thickness in a range of approximately 15–40 nm. For a ferroelectric random access memory, the thickness may be in a range of approximately 15–300 nm. The actual thickness depends on the electrical characteristics necessary and the device performance that is desired.

The second electrode is then formed as shown in box 112 in FIG. 1. Referring to FIG. 6, the second electrode layer 64 is then formed over the substrate. This material can be formed in a similar fashion as the first electrode or may be different. Typical materials used for the second electrode include platinum, palladium, iridium, ruthenium or the like. Again, the oxygen doping of the second electrode layer may be used to enhance the electrical properties of the capacitor.

Figure 7:
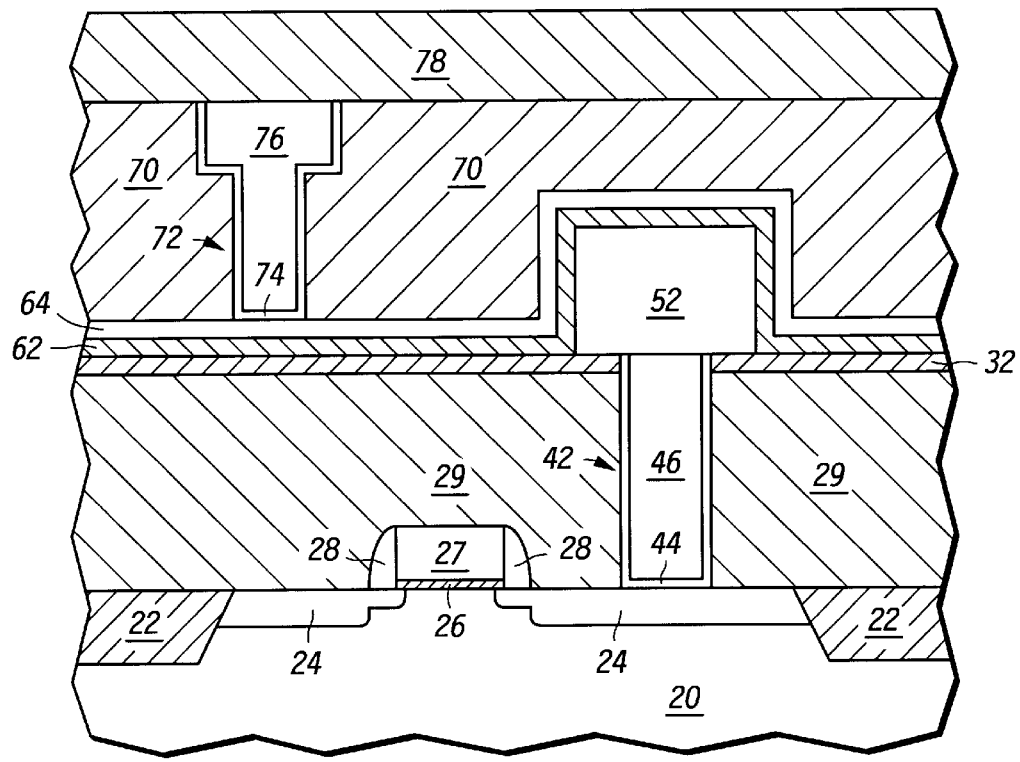

Processing is continued to form a substantially completed device as illustrated in FIG. 7. In this FIG., a second ILD layer 70 is deposited and patterned to form a dual inlaid opening 72. An adhesion/barrier film 74 is then formed that makes contact with the second electrode layer 64. The opening is then filled with a conductive fill material 76 that typically is mostly aluminum or copper. After forming the layers, the substrate is then polished to remove that portion of the films 74 and 76 lying outside the dual inlaid opening 72. A passivation layer 78 is then formed over the layer of the uppermost interconnects. Although not shown, electrical connections are made to the other doped region 24 and the gate electrode 27. Further, if other interconnect levels are required, additional ILD layers and interconnects can be formed. The process steps needed to form this are relatively easy to integrate. Additionally, the use of the semiconductor-containing source layer can be an antireflective layer and improve adhesion between the electrode and the ILD layers.

In the foregoing specification, the invention has been described with reference to specific embodiments. However, one of ordinary skill in the art appreciates that various modifications and changes can be made without departing from the scope of the present invention as set forth in the claims below. Accordingly, the specification and FIGS. are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A process for forming a semiconductor device comprising:
    forming a conductive region that is capable of being oxidized into an insulator;
    forming a first electrode over the conductive region, wherein:
        the first electrode includes grain boundaries; and
    annealing the first electrode using an oxygen-containing gas, wherein dopant atoms lie within the first electrode at the grain boundaries and improve an oxygen barrier property of the first electrode compared to the dopant atoms not being present at the grain boundaries; and
    forming a semiconductor-containing source layer before forming the first electrode,
    wherein:
        the dopant atoms are semiconductive atoms; and
        the dopant atoms migrate into the first electrode during the annealing.

2. The process of claim 1, wherein:
    the dopant atoms are incorporated into the first electrode by ion implantation; and
    the dopant atoms are selected from a group of elements consisting of Si, Be, Al, Ge, As, and combinations thereof.

3. The process of claim 2, wherein the ion implantation is performed to a dose in a range of approximately 1E15 to 1E16 ions per square centimeter.

4. The process of claim 1, wherein annealing is performed at a temperature in a range of approximately 400–700° C. for a time of approximately 2–30 minutes.

5. The process of claim 1, wherein the first electrode includes a material selected from the group consisting of platinum, palladium, iridium, ruthenium, rhodium, and osmium.

6. The process of claim 1, further comprising:
    forming a capacitor dielectric layer over the first electrode; and
    forming a second electrode over the capacitor dielectric layer,
    wherein the annealing is performed after forming the capacitor dielectric layer.

7. The process of claim 6, wherein the capacitor dielectric layer is selected from the group consisting of a high-k dielectric material and a ferroelectric material.

8. The process of claim 1, wherein a concentration of the dopant atoms in the first electrode is in a range of approximately 0.10–20.0 atomic percent.

9. A process for forming a semiconductor device comprising:
    forming an insulating layer over a substrate;
    forming a semiconductor containing source layer over the insulating layer;
    defining an opening extending through the insulating layer and semiconductor-containing source layer;
    forming a conductive structure within the opening;
    forming a first electrode over the semiconductor-containing source layer, wherein the first electrode includes gain boundaries: and
    incorporating oxygen atoms into the first electrode; and
    annealing the substrate, wherein during the anneal, semiconductor atoms form the semiconductor-containing source layer migrate into the first electrode at the grain boundaries and improve an oxygen barrier property of the first electrode compared to the dopant atoms not being present at the grain boundaries.

10. The process of claim 9, wherein the semiconductor-containing source layer includes atoms selected from the group consisting of silicon, germanium, carbon, and tin.

11. The process of claim 9, wherein a thickness of semiconductor-containing source layer is in a range of approximately 5–100 nanometers.

12. The process of claim 9, wherein incorporating the oxygen atoms into the first electrode occurs in-situ during forming the first electrode.

13. The process of claim 9, wherein incorporating the oxygen atoms into the first electrode is performed after forming the first electrode.

14. The process of claim 13, wherein incorporating the oxygen atoms is performed by an anneal using an oxygen-containing gas, at a temperature in a range of approximately 400–700° C., and for a time in a range of approximately 2–30 minutes.

15. The process of claim 9, wherein after incorporating the oxygen atoms, the first electrode has an oxygen content in a range of approximately 0.10–20.0 atomic percent.

16. The process of claim 9, wherein the first electrode includes a material selected from the group consisting of platinum, palladium, iridium, ruthenium, rhodium, and osmium.

17. The process of claim 9, further comprising:
   forming a capacitor dielectric layer over the first electrode; and
   forming a second electrode over the capacitor dielectric layer.

18. The process of claim 17, wherein the capacitor dielectric layer is selected from the group consisting of a high-k dielectric material and a ferroelectric material.

19. The process of claim 9, wherein a thickness of the first electrode is in a range of approximately 50–200 nanometers.

* * * * *

UNITED STATES PATENT AND TRADEMARK OFFICE
CERTIFICATE OF CORRECTION

PATENT NO.   : 6,518,070 B1
DATED        : February 11, 2003
INVENTOR(S)  : Prasad V. Alluri et al.

Page 1 of 1

It is certified that error appears in the above-identified patent and that said Letters Patent is hereby corrected as shown below:

<u>Column 6,</u>
Line 51, change "form" to -- from --

Signed and Sealed this

Twenty-third Day of September, 2003

JAMES E. ROGAN
*Director of the United States Patent and Trademark Office*